US010680296B2

(12) United States Patent
Moser et al.

(10) Patent No.: US 10,680,296 B2
(45) Date of Patent: Jun. 9, 2020

(54) ENERGY STORE OF A MOTOR VEHICLE

(71) Applicant: Mahle International GmbH, Stuttgart (DE)

(72) Inventors: Michael Moser, Ellwangen (DE); Dominique Weinmann, Rottenburg (DE)

(73) Assignee: Mahle International GmbH (DE)

( * ) Notice: Subject to any disclaimer, the term of this patent is extended or adjusted under 35 U.S.C. 154(b) by 20 days.

(21) Appl. No.: 15/574,153

(22) PCT Filed: May 4, 2016

(86) PCT No.: PCT/EP2016/059987
§ 371 (c)(1),
(2) Date: Nov. 14, 2017

(87) PCT Pub. No.: WO2016/184687
PCT Pub. Date: Nov. 24, 2016

(65) Prior Publication Data
US 2018/0131050 A1 May 10, 2018

(30) Foreign Application Priority Data
May 15, 2015 (DE) .................. 10 2015 208 999

(51) Int. Cl.
*H01M 10/6556* (2014.01)
*H01M 10/613* (2014.01)
(Continued)

(52) U.S. Cl.
CPC ........ *H01M 10/613* (2015.04); *F28D 1/0366* (2013.01); *F28D 1/05366* (2013.01);
(Continued)

(58) Field of Classification Search
CPC .................. H01M 10/613; H01M 10/65–6556
USPC ........................................ 429/120
See application file for complete search history.

(56) References Cited

U.S. PATENT DOCUMENTS 3,745,048 A * 7/1973 Dinkler et al. ... H01M 10/6563
429/120
6,354,002 B1 3/2002 Wright et al.
(Continued)

FOREIGN PATENT DOCUMENTS

CN 102305560 A 1/2012
DE 102011084000 A1 5/2012
(Continued)

OTHER PUBLICATIONS

EPO Machine Translation of DE 10012218102 originally published to Hinkeldey et al. dated Jun. 6, 2013.*
(Continued)

*Primary Examiner* — Jonathan G Leong
(74) *Attorney, Agent, or Firm* — Fishman Stewart PLLC

(57) ABSTRACT

An energy store of a motor vehicle may include at least one battery cell and a fluid channel having a temperature control fluid that may control a temperature of the at least one battery cell. The fluid channel may be defined by a fluid channel arrangement having two walls and a plurality of spacers arranged therebetween. The plurality of spacers may be configured for a needs-based temperature control of the at least one battery cell. The plurality of spacers may be arranged so that a coolant flow is conducted directly to a hot spot of the at least one battery cell. At least one of the two walls may comprise an organic sheet and may be connected, via glue or welding, to the plurality of spacers.

18 Claims, 1 Drawing Sheet

(51) Int. Cl.

| | | |
|---|---|---|
| *H01M 10/625* | (2014.01) | |
| *H01M 10/6566* | (2014.01) | |
| *H01M 10/6568* | (2014.01) | |
| *F28D 1/03* | (2006.01) | |
| *F28F 3/02* | (2006.01) | |
| *H01M 10/66* | (2014.01) | |
| *F28D 1/053* | (2006.01) | |
| *F28F 1/22* | (2006.01) | |
| *F28F 9/02* | (2006.01) | |
| *F28F 9/14* | (2006.01) | |
| *H05K 7/20* | (2006.01) | |
| *H01M 2/10* | (2006.01) | |

(52) U.S. Cl.
CPC ............... *F28F 1/22* (2013.01); *F28F 3/022* (2013.01); *F28F 9/0212* (2013.01); *F28F 9/14* (2013.01); *H01M 10/625* (2015.04); *H01M 10/6556* (2015.04); *H01M 10/6566* (2015.04); *H01M 10/6568* (2015.04); *H01M 10/66* (2015.04); *H05K 7/20* (2013.01); *F28F 2250/02* (2013.01); *F28F 2265/10* (2013.01); *H01M 2/1072* (2013.01)

(56) References Cited

U.S. PATENT DOCUMENTS

| | | | | |
|---|---|---|---|---|
| 7,764,496 B2 * | 7/2010 | Nguyen | ................ | H01G 2/08 361/697 |
| 8,940,425 B2 | 1/2015 | Toepfer | | |
| 9,316,450 B2 | 4/2016 | Engelhardt et al. | | |
| 9,429,372 B2 | 8/2016 | Hirsch et al. | | |
| 9,546,827 B2 | 1/2017 | Ludwig et al. | | |
| 9,666,912 B2 | 5/2017 | Obrist et al. | | |
| 2001/0026886 A1 * | 10/2001 | Inui | ..................... | H01M 2/1061 429/120 |
| 2010/0104927 A1 | 4/2010 | Albright | | |
| 2015/0050539 A1 * | 2/2015 | Peterl | ..................... | H01M 2/16 429/130 |

FOREIGN PATENT DOCUMENTS

| | | | | |
|---|---|---|---|---|
| DE | 102011077838 A1 | 12/2012 | | |
| DE | 102011079091 A1 | 1/2013 | | |
| DE | 102012218102 A1 | 6/2013 | | |
| DE | 102013200859 A1 | 8/2013 | | |
| DE | 102012103128 A1 | 10/2013 | | |
| DE | 102012019922 A1 * | 4/2014 | ............... | B60K 1/04 |
| EP | 0623798 A2 | 11/1994 | | |
| EP | 2744034 A1 | 6/2014 | | |
| GB | 2508514 A | 6/2014 | | |
| WO | WO-2013021037 A1 | 2/2013 | | |
| WO | WO-2014086989 A1 | 6/2014 | | |

OTHER PUBLICATIONS

Machine Translation of DE-102012019922-A1 from Google Patents originally published Apr. 2014 to Reinsch et al.*
English abstract for CN-102305560.
English abstract for DE-102012218102.
English abstract for DE-102012103128.
English abstract for EP-0623798.

* cited by examiner

ENERGY STORE OF A MOTOR VEHICLE

CROSS-REFERENCE TO RELATED APPLICATIONS

This application claims priority to International Patent Application No.: PCT/EP2016/059987 filed on May 4, 2016, and German Patent Application No.: DE 10 2015 208 999.1 filed on May 15, 2015, the contents of which are incorporated herein by reference in their entirety.

TECHNICAL FIELD

The present invention relates to an energy store of a motor vehicle with at least one battery cell according to the introductory clause of claim 1. The invention further relates to a fluid channel arrangement for such an energy store and a method for the production of such a fluid store and such an energy store.

In modern hybrid and electric vehicles, high efficiency energy stores are coming into use increasingly, which must be temperature-controlled actively with regard to an optimum function. In particular, a cooling of these battery cells is especially important here for an optimization of efficiency. Currently, for example, cooling plates which are flowed through by fluid are used for this, which additionally have a heating function and thereby enable both a cooling and also a heating of the battery cells. Such cooling plates must of course be electrically insulated with respect to the battery cells and/or a housing and in addition must have a sufficient diffusion resistance.

BACKGROUND

From DE 10 2012 218 102 A1 a generic energy store of a motor vehicle is known, with a housing and with at least one battery cell arranged therein, wherein a fluid channel for controlling the temperature of the battery cell is arranged between the housing and the at least one battery cell. An electrical interface of the at least one battery cell lies here outside the fluid channel.

From DE 10 2011 077 838 A1 a heat exchanger is known with a tube block having a plurality of tubes, aligned substantially in a parallel manner, for directing a temperature control fluid, wherein at least the ends of the tubes are connected to one another. The heat exchanger further comprises at least one collecting box which is configured to receive a temperature control fluid from the tubes, wherein the at least one collecting box has a height in the interior which corresponds, within a tolerance range, to the height of the ends of the tubes.

From DE 10 2011 079 091 A1 a collector for a cooling fluid with a base is known. The base has an interface for connecting a chamber of the collector to at least one cooling tube, and has an opening which extends at least over a partial region of the chamber. The collector has furthermore a cover, which is configured to close the opening of the base in a fluid-tight manner. The cover itself is configured here as a wire or extrusion profile.

From EP 2 744 034 A1 a further heat exchanger is known.

A disadvantage in the energy stores which are known from the prior art and which are to be temperature-controlled is their comparatively complex and expensive production method and a cooling or respectively temperature control of the energy store which is not always needs-based.

This problem is solved according to the invention by the subject of the independent claims. Advantageous embodiments are the subject of the dependent claims.

SUMMARY

The present invention is based on the general idea of providing an energy store with a fluid channel arrangement which is produced especially and in particular separately, which on the one hand is able to be produced at a favourable cost and which on the other hand additionally enables an optimized temperature control of the energy store and thereby an optimum efficiency thereof. The energy store according to the invention, which can be used for example in a motor vehicle, has at least one battery cell, arranged in particular in a housing, usually a plurality of battery cells, wherein preferably between the housing and the at least one battery cell a fluid channel is arranged for controlling the temperature of the battery cell. It is, of course, clear here that the housing does not have to be a housing in the conventional sense, but rather the energy store can also be constructed differently, so that the housing does not belong to the energy store, but rather, for example, represents a different component. This fluid channel is now formed according to the invention by a fluid channel arrangement, which has two walls and spacers arranged therebetween. This makes it possible, in contrast to fluid channels known from the prior art, to prefabricate the fluid channel arrangement entirely separately, in particular as a favourably priced composite component, wherein it is furthermore possible to arrange the spacers in the fluid channel arrangement such that a temperature control fluid flowing in the fluid channel arrangement enables an optimum temperature control, in particular an optimum cooling, of the battery cells. Where precisely the individual spacers must be arranged between the two walls of the fluid channel arrangement can be precisely determined beforehand through a temperature detection of the individual battery cells in the operating state. With the fluid channel arrangement according to the invention and, furthermore, also with the energy store according to the invention, it is therefore possible to construct the latter at a distinctly more favourable cost compared to energy stores known from the prior art, and at the same time to increase its efficiency through the optimized temperature control, in particular the optimized cooling.

In an advantageous further development of the solution according to the invention, at least one wall and/or at least one spacer is/are formed from an electrically insulating material, in particular from a thermoplastic plastic. Hereby, the possibility opens up not only of producing an electrical insulation between the battery cells and a housing, formed for example from metal, but such a thermoplastic plastic can also be produced and processed comparatively simply and at a favourable cost.

In a further advantageous embodiment of the solution according to the invention, at least one spacer is configured as a tube section or as a bushing. In this case, the at least one spacer would have a round outer contour and thereby an outer contour favourable with respect to flow, wherein of course it is alternatively also conceivable that the at least one spacer has a non-round outer contour, in particular an oval or angled outer contour. For example, an outer contour configured in cross-section in the manner of a wing profile is also conceivable here, whereby a directing of flow can be achieved.

Expediently, at least one wall of the fluid channel arrangement is formed from a foil, in particular from a plastic foil or from a plastic composite foil, from an organic sheet or from a plastic sheet and is connected, in particular glued or welded, to the spacers. A fluid channel arrangement formed in particular with two walls made from foil enables here a comparatively simple manufacture, in particular in so far as the foils are welded to the spacers arranged therebetween by means of a thermal joining method, and at the same time such a fluid channel arrangement offers a comparatively high degree of flexibility with regard to an adapting to an outer contour of the battery cells and/or to an inner contour of the housing.

Expediently, the spacers are arranged such that, or respectively their outer contour is configured such that, a coolant flow is conducted directly to a so-called hot spot at least of one battery cell. In particular in hybrid or electric vehicles, high-performance batteries come into use which must be temperature-controlled optimally to develop their full efficiency. The optimum temperature control also includes in particular a needs-based and locally different cooling of the individual battery cells, so that in particular so-called hot spots, at which an overheating of individual battery cells is to be feared, must be cooled separately. This is possible by means of the fluid channel arrangement according to the invention, because by means of the special arrangement or respectively alignment of the individual spacers, a fluid flow (temperature control fluid), for example coolant, flowing in the fluid channel arrangement, can be directed in a defined manner to corresponding sites which are particularly to be cooled, i.e. for example to so-called hot spots.

In a further advantageous embodiment of the solution according to the invention, the fluid channel arrangement is connected in a heat-transferring manner to at least one battery cell, in particular for example is glued thereto or is connected by means of a heat-conductive paste. Hereby, an optimum heat transfer and thereby also an optimum temperature control of the at least one battery cell are to be able to be made possible.

Expediently, a plurality of spacers are arranged in direct contact to one another and thereby form a flow-guiding contour. In addition to a singular, i.e. individual arrangement of individual spacers, additionally or alternatively also an arranging in succession or respectively a joining to one another of a plurality of spacers is conceivable, whereby not only flow-guiding contours, but furthermore flow-guiding paths themselves can be created in the fluid channel arrangement without difficulty.

The present invention is further based on the general idea of producing or respectively offering a fluid channel arrangement for a previously described energy store, which has two walls and spacers arranged therebetween, wherein at least one wall, formed from foil, in particular from plastic foil or from plastic composite foil, from organic sheet or from a plastic sheet, is connected, in particular glued or welded, to the spacers. Such a fluid channel arrangement can be configured optimally here by the previous determining of a temperature distribution at the battery cells of an energy store with regard to the positions of the spacers, and owing to the possibility of separate production, can also be manufactured to the highest quality.

The present invention is further based on the general idea of indicating a method for the production of the previously mentioned fluid channel arrangement, in which firstly a temperature distribution at least of one battery cell, preferably of all battery cells, of an energy store is determined at different operating states. Hereby, in particular, sites which are to be especially temperature-controlled, such as for example hot spots, at which a rapid critical temperature rise is to be feared, are to be determined. Subsequently, a fluid flow is calculated, optimally temperature-controlling the determined temperature distribution, for example a coolant flow, in a fluid channel arrangement. With this calculation, therefore the so-called hot spots are taken into account and are considered with an increased coolant flow. From this calculated fluid flow, subsequently a template can be produced for the arrangement of the spacers or respectively also for the formation of the spacers, in particular with regard to their outer contour. By means of this template, the spacers are now positioned on a first wall of the fluid channel arrangement, wherein the first wall can be configured for example as a foil, or a sheet made of plastic, in particular of a thermoplastic plastic, or an organic sheet. It is important here merely that at least one of the walls is not electrically conductive, so that the entire fluid channel arrangement can function as an electrical insulator between the battery cells and, for example, the housing. Through the position of the individual spacers, established by means of the template, these spacers can be positioned exactly on the first wall and, for example, can be connected immediately thereto, in particular welded or glued thereto. Subsequently, the template is removed and a second wall is placed onto the spacers, wherein then only the second wall or else both walls are connected, in particular glued or welded, to the spacers. By means of such a template, fluid channel arrangements which are optimized for such energy stores can now be produced efficiently.

The fluid channel arrangement produced by the method described in the previous paragraph must now in addition be merely placed into the possibly present housing of the energy store and subsequently the battery cells must be inserted. The fluid channel arrangement is connected to a temperature control fluid, for example a coolant, by means of corresponding connections.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained further in the following description, wherein the same reference numbers refer to identical or similar or functionally identical components.

There are shown here, respectively diagrammatically,

DETAILED DESCRIPTION OF THE DRAWINGS

Figure 1:
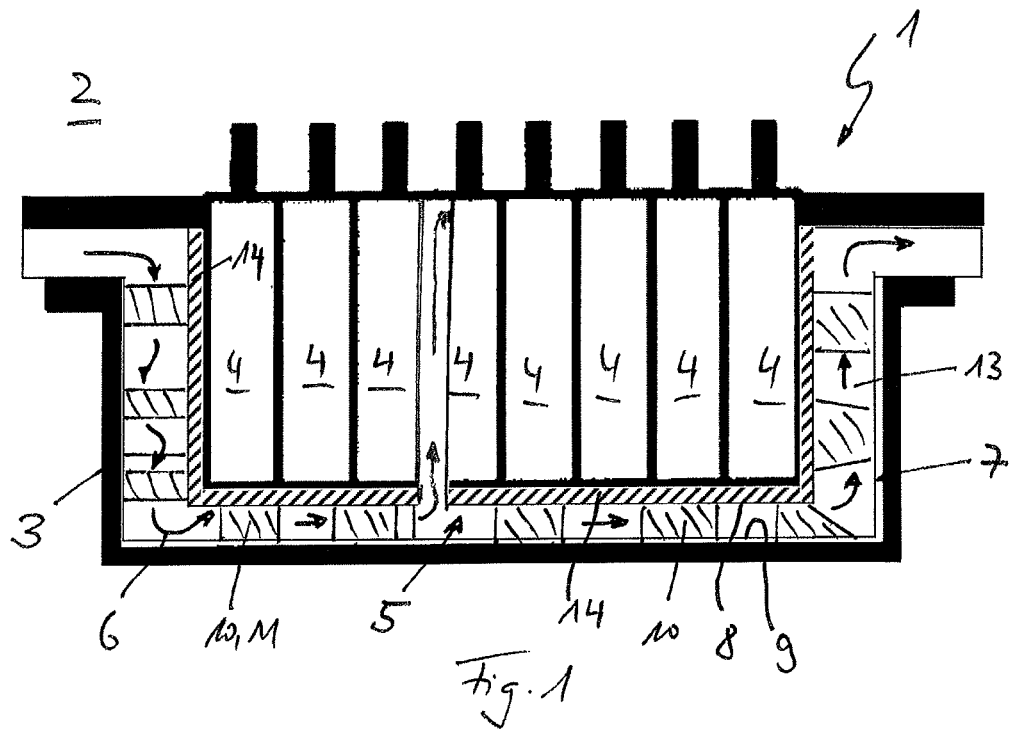
FIG. 1 a sectional illustration through an energy store according to the invention, FIG. 2 a view partially in section through a fluid channel arrangement according to the invention, FIG. 3 a sectional illustration through the fluid channel arrangement according to the invention.
Figure 2:
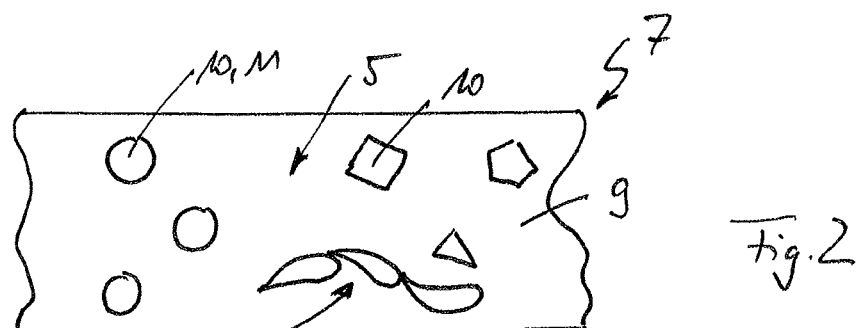

According to FIG. 1, an energy store 1, according to the invention, of a motor vehicle 2, otherwise illustrated only diagrammatically, has in the instance shown in the drawings, a housing 3 and a plurality of battery cells 4 arranged therein. The energy store 1 is configured here as a rechargeable energy store and can be used for example in a hybrid or electric vehicle. Between the housing 3 and the battery cells 2, a fluid channel 5 is arranged here, through which a temperature control fluid 6, for example a coolant, is directed for controlling the temperature of the battery cells 4. According to the invention, the fluid channel 5 is now formed by a fluid channel arrangement 7 (cf. also FIGS. 2 and 3), which has two walls 8, 9 and spacers 10 arranged therebetween. Furthermore, the spacers 10 are arranged or respectively aligned such that a needs-based temperature control, in particular a needs-based cooling, of the battery cells 4 can be achieved. This is greatly advantageous in particular to increase the efficiency of the energy store, because for example so-called locally occurring hot spots can be cooled in a needs-based manner.

At least one of the walls 8, 9 and/or at least one spacer 10 is formed here from an electrically insulating material, for example from a thermoplastic plastic. The spacers 10 themselves can be configured here for example as tube sections or as bushings 11 (cf. also FIGS. 2 and 3) and thereby produced from a tube by means of a corresponding cutting to length. Alternatively hereto, the spacers 10 can of course also have a non-round outer contour, in particular an oval or an angled outer contour, as is illustrated for example in the spacers 10 according to FIG. 2. When the spacers 10 are configured as tube sections or respectively as bushings 11, these usually have a round outer contour. By means of the respectively selected outer contour and/or the arrangement of the spacers 10, a particularly targeted flow guidance of the temperature control fluid 6 and thereby a particularly needs-based temperature control of the individual battery cells 4 can be achieved. According to FIG. 1, the fluid channel 5 here is arranged merely between the housing 3 and the battery cells 4, wherein of course additionally further fluid channels, not illustrated, can be provided between the individual battery cells 4. Also, of course, the housing 3 can be dispensed with, so that only the fluid channel arrangement 7 surrounds the battery cells 4.

In order to be able to produce the fluid channel arrangement 7 at a favourable cost and in a simple manner with regard to manufacturing, at least one wall 8, 9 is formed from foil, in particular from plastic foil or from a plastic composite foil, from an organic sheet or from a plastic sheet and is connected, in particular welded or glued, to the spacers 10, 11. Furthermore, a plurality of spacers 10 can also be arranged in direct contact to one another, and can thereby form a flow-guiding contour 12 (cf. FIG. 2).

Figure 3:
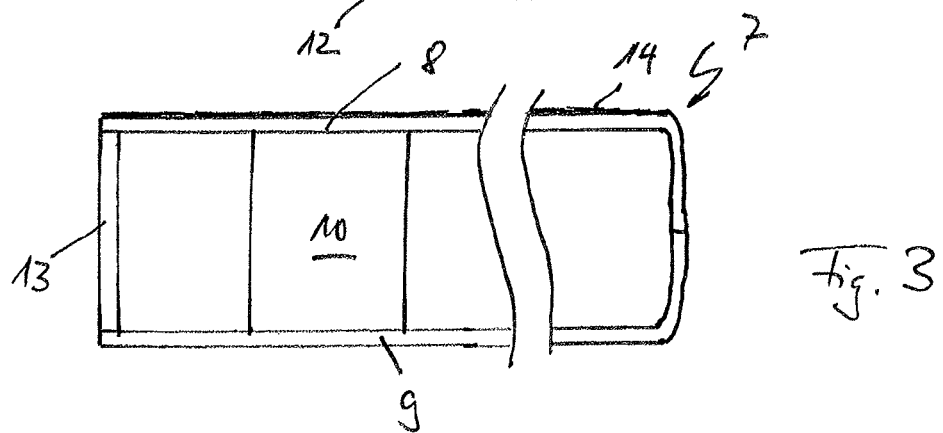

Observing in addition FIG. 3, it can be seen that the two walls 8, 9 are connected closely to one another on the edge side directly (right side) or indirectly via an edging element 13 (left side). In order to be able to increase a heat-transferring contact between the fluid channel arrangement 7 and the battery cells 4, this can be connected to the battery cells 4 for example by means of a heat-conductive paste 14 (cf. FIG. 1).

It is of great advantage in the energy store 1 according to the invention that the latter has a variable flow field, can be produced at a favourable cost and has a particularly great freedom of design and possibility for adaptation to a purpose of use and installation space. Furthermore, the fluid channel arrangement 7 according to the invention has an integrated barrier layer and is configured through the use of plastic as an electrical insulator between the battery cells 4 and the housing 3, so that basically also a metallic housing 3 can come into use.

The fluid channel arrangement 7 according to the invention is produced in accordance with the method according to the invention, described below. Firstly, a temperature distribution of at least one battery cell 4, preferably of all battery cells 4 of the energy store 1 is determined at different operating states. Subsequently, a fluid flow is calculated, optimally controlling the temperature of the determined temperature distribution in a fluid channel arrangement 7 arranged preferably between the battery cells 4 which are to be temperature-controlled and the housing 3. From this calculated fluid flow, a template is produced for arranging and configuring the individual spacers 10. By means of this produced template, the corresponding spacers 10 are positioned on the first wall 9 of the fluid channel arrangement 7 and are already fixed for example, in particular by means of a gluing or welding. Subsequently, the template is removed and the second wall 8 is placed onto the pre-positioned spacers 10, wherein subsequently the second wall 8 is connected, for example glued or welded, to the spacers 10. Of course, a connecting of the two walls 8, 9 to the spacers 10 can also take place in a single operating step, i.e. after the removal of the template and after the applying of the second wall 8.

A fluid channel arrangement 7 produced in such a manner can be subsequently placed into the housing 3 and then the battery cells 4 can be inserted, wherein now by means of the fluid channel arrangement 7 according to the invention a needs-based temperature control, in particular a needs-based cooling of the individual battery cells 4 can be achieved.

With the fluid channel arrangement 7 according to the invention and the energy store 1 equipped therewith, a favourably priced and optimized local—in particular with regard to so-called hot spots—, needs-based temperature control of the energy store 1 can be achieved, whereby its efficiency can be increased.

The invention claimed is:
1. An energy store of a motor vehicle comprising:
at least one battery cell;
a fluid channel including a temperature control fluid configured to control a temperature of the at least one battery cell;
wherein the fluid channel is defined by a fluid channel arrangement having two walls and a plurality of spacers arranged therebetween, wherein the plurality of spacers are configured for a needs-based temperature control of the at least one battery cell, wherein the plurality of spacers are arranged so that a coolant flow is conducted directly to a hot spot of the at least one battery cell;
wherein at least one of the two walls comprises an organic sheet and is connected, via glue or welding, to the plurality of spacers;
wherein at least some of the plurality of spacers are arranged within the fluid channel in direct contact with one another along the at least one wall connected to the plurality of spacers and define a flow-guiding contour;
wherein each spacer of the plurality of spacers has an outer surface extending between the two walls delimiting an outer contour of the spacer therebetween; and
wherein the outer surface of each of the at least some of the plurality of spacers abuts against the outer surface of another one of the at least some of the plurality of spacers.

2. The energy store according to claim 1, wherein at least one of the two walls and at least one of the plurality of spacers comprise an electrically insulating material.

3. The energy store according to claim 1, wherein the two walls are closely connected to one another on an edge side directly or indirectly via an edging element.

4. The energy store according to claim 1, wherein at least one of the plurality of spacers is a tube section.

5. The energy store according to claim 1, wherein at least one of the plurality of spacers is a bushing.

6. The energy store according to claim 1, wherein the outer contour of at least one of the plurality of spacers is a non-round outer contour.

7. The energy store according to claim 6, wherein the non-round outer contour of the at least one of the plurality of spacers is an oval outer contour.

8. The energy store according to claim 6, wherein the non-round outer contour of the at least one of the plurality of spacers is an angled outer contour.

9. The energy store according to claim 1, further comprising a metallic housing at least partially surrounding the fluid channel arrangement, wherein the fluid channel arrangement is disposed between the at least one battery cell and the metallic housing, and the at least one wall comprising the organic sheet is arranged on the metallic housing and connected via the plurality of spacers to the other of the two walls.

10. The energy store according to claim 1, wherein the at least one battery cell comprises a plurality of battery cells where two adjacent battery cells of the plurality of battery calls are arranged spaced apart from one another, and wherein at least some of the plurality of spacers are structured and arranged to direct the coolant flow from the fluid channel to an interspace between the two adjacent battery cells for the needs-based temperature control.

11. The energy store according to claim 10, wherein the plurality of spacers are arranged in the fluid channel at predetermined positions corresponding to predefined sites of individual battery cells having the hot spot to provide a targeted flow guidance and locally different cooling to each of the plurality of battery cells.

12. The energy store according to claim 1, wherein in an operating state the at least one battery cell has at least one hot surface including at least one area having a locally elevated temperature relative to a temperature of a surrounding area of the at least one hot surface, and wherein the at least one area defines the hot spot.

13. The energy store according to claim 1, wherein the plurality of spacers are each structured as a bushing.

14. The energy store according to claim 1, wherein:
the plurality of spacers includes a first subset of spacers and a second subset of spacers;
the first subset of spacers are arranged within the fluid channel spaced apart from one another along the at least one wall connected to the plurality of spacers such that the first subset of spacers do not directly contact one another; and
the second subset of spacers is defined by the at least some of the plurality of spacers arranged in direct contact with one another.

15. The energy store according to claim 1, wherein the outer surface of each of the at least some of the plurality of spacers abuts against the outer surface of another one of the at least some of the plurality of spacers from a first wall of the at least two walls to a second wall of the at least two walls for forming the flow-guiding contour.

16. The energy store according to claim 1, wherein at least one of the plurality of spacers is an individual spacer disposed in a singular arrangement spaced apart from a surrounding perimeter of the at least one wall, and wherein the at least some of the plurality of spacers are arranged one after another in succession such that at least a portion of the outer surface of each of the at least some of the plurality of spacers form the flow-guiding contour.

17. An energy store of a motor vehicle comprising:
at least one battery cell;
a fluid channel including a temperature control fluid configured to control a temperature of the at least one battery cell;
wherein the fluid channel is defined by a fluid channel arrangement having two walls and a plurality of spacers arranged therebetween, wherein the plurality of spacers are configured for a needs-based temperature control of the at least one battery cell, wherein the plurality of spacers are arranged so that a coolant flow is conducted directly to a hot spot of the at least one battery cell;
wherein at least one of the two walls comprises an organic sheet and is connected, via glue or welding, to the plurality of spacers;
wherein at least some of the plurality of spacers are arranged within the fluid channel in direct contact with one another along the at least one wall connected to the plurality of spacers and define a flow-guiding contour;
wherein each of the at least some of the plurality of spacers have a non-round outer contour defined by an outer surface extending between the two walls delimiting the spacer therebetween; and
wherein the outer surface of each of the at least some of the plurality of spacers abuts against the outer surface of another one of the at least some of the plurality of spacers.

18. A method for producing an energy store comprising:
providing at least one battery cell and a fluid channel arrangement having two walls and a plurality of spacers arranged therebetween configured for a needs-based temperature control of the at least one battery cell, wherein at least one of the two walls comprises an organic sheet and is connected, via glue or welding, to the plurality of spacers;
determining a temperature distribution of the at least one battery cell at different operating states and identifying at least one hot spot of the at least one battery cell;
calculating a fluid flow in the fluid channel arrangement, optimally controlling a temperature of the determined temperature distribution of the at least one battery cell;
producing a template from the calculated fluid flow for the arrangement of the plurality of spacers such that the plurality of spacers conduct the fluid flow directly to the at least one hot spot of the at least one battery cell;
aligning the plurality of spacers via the template to position the plurality of spacers on a first wall of the two walls of the fluid channel arrangement;
removing the template and applying a second wall of the two walls onto the plurality of spacers; and
connecting the second wall of the at least two walls, via glue or welding, to the plurality of spacers;
wherein at least some of the plurality of spacers are arranged within the fluid channel in direct contact with one another along the at least one wall connected to the plurality of spacers and define a flow-guiding contour;
wherein each spacer of the plurality of spacers has an outer surface extending between the two walls delimiting an outer contour of the spacer therebetween; and
wherein the outer surface of each of the at least some of the plurality of spacers abuts against the outer surface of another one of the at least some of the plurality of spacers.

* * * * *